(12) United States Patent
Beyer

(10) Patent No.: US 7,623,996 B1
(45) Date of Patent: Nov. 24, 2009

(54) MASS MORPHING SYSTEM AND METHOD

(75) Inventor: Mark E. Beyer, Wichita, KS (US)

(73) Assignee: Textron Innovations, Inc., Providence, RI (US)

( * ) Notice: Subject to any disclaimer, the term of this patent is extended or adjusted under 35 U.S.C. 154(b) by 480 days.

(21) Appl. No.: 11/256,534

(22) Filed: Oct. 21, 2005

(51) Int. Cl.
*G06F 17/10* (2006.01)

(52) U.S. Cl. .............................. 703/2; 703/1

(58) Field of Classification Search .............. 703/2, 703/1, 6, 7, 13

See application file for complete search history.

(56) References Cited

U.S. PATENT DOCUMENTS

2007/0016388 A1* 1/2007 Shimel et al. .................. 703/1

OTHER PUBLICATIONS

Beyer, M., MassMorph, May 14, 2005, Society of Allied Weight Engineers Conference, paper No. 3374, 14 pages.*

* cited by examiner

*Primary Examiner*—Paul L Rodriguez
*Assistant Examiner*—Luke Osborne
(74) *Attorney, Agent, or Firm*—Lathrop & Gage LLP

(57) ABSTRACT

Disclosed is a system and process for creating mass property models for new product designs. Engineers are able to use this robust model to perform various assessments. The system morphs legacy mass property values into new design project configurations. This is done by building linear transformations in four-dimensional homogeneous coordinates. The transformations capture source and target geometric characteristic shapes. Filtering techniques are used to retrieve relevant source mass properties from the database. These detailed mass properties are collected into bay wise functional groups and then converted to equivalent mass particulates. These point masses are transformed from the source domain to the target domain, and summed back together to generate target mass property data. The process outputs detailed mass property distributions used in engineering models and reports and is continually updated to accommodate detailed designs throughout project development.

13 Claims, 3 Drawing Sheets

BEFORE

AFTER

MASS MORPHING SYSTEM AND METHOD

CROSS-REFERENCE TO RELATED APPLICATIONS

None.

STATEMENT REGARDING FEDERALLY SPONSORED RESEARCH OR DEVELOPMENT

None.

BACKGROUND OF THE INVENTION

1. Field of the Invention

The invention relates to estimating the mass properties of designed products. More specifically, to creating workable models and generating reports showing these properties using legacy data.

2. Description of the Related Art

Estimation of mass data is an integral part of the conceptual design of new aircraft. The part count on a typical business jet is in the hundreds of thousands. Tens of thousands of engineering hours are invested to build accurate mass properties databases of an aircraft to support weight control and structural analyses efforts during project development.

Conceptual design processes have historically been constrained by time to rely on a few dozen parametric equations for extrapolating weight of major components and systems and the development of simplified computer aided design (CAD) and finite element model (FEM) models to generate quasi-distributed analysis models. This process required relatively long lead times to generate mass properties with adequate quality for Design and Analysis processes for single design iterations, and rarely was able to meet requirements to quickly review design alternatives.

The integrity of mass properties estimates directly impact the ability of a proposed aircraft design to meet its performance and mission requirements. Traditional methods often result in sub-optimal design decisions as many detail nuances spanning distinctly different design approaches are overlooked. Inaccuracies inherent to these methods carry heavy penalties leading to compromises, costly engineering changes, increased potential aircraft ballast requirements, reduced payload and performance, leading ultimately to reduced sales and project profitability.

There is a need in the art for an alternative to these conventional processes which eliminates dependence on parametric data models for estimating component weights and the need to create CAD and FEM representations of proposed aircraft to estimate mass property distributions. Instead engineers devote more time toward reviewing a greater number of alternate design approaches and optimizing design performance.

There is also a need for a process which reduces the risks in the process by providing credible distributed mass properties to accurately reflect changes caused by design permutations. Delays caused by permutations historically can take weeks. And the resulting mass models are seldom as robust as desired. Inaccuracies in these mass models drive decisions toward off-optimal designs which negatively impact other analyses and flight vehicle performance, and conventional weight and balance issues are often not identified until late in the development program causing late reengineering efforts.

SUMMARY OF THE INVENTION

The system and methods of the present invention overcomes these disadvantages of the conventional processes by creating a mass morphing process.

One objective of the present invention is in the creation of a method in which geometrical information regarding a source aircraft design is retrieved from a database. Homogeneous coordinates are used to define descretized geometric units, or bays for both the source and target data. The source data coordinates and the target data coordinates are then used to create a transformation which is used to create new target coordinates via iteration. The morphing transformation is then used to morph filtered mass properties from the source into mass properties for the target.

BRIEF DESCRIPTION OF THE SEVERAL VIEWS OF THE DRAWINGS

The present invention is described in detail below with reference to the attached drawing figures, wherein.

DETAILED DESCRIPTION OF THE INVENTION

Figure 1:
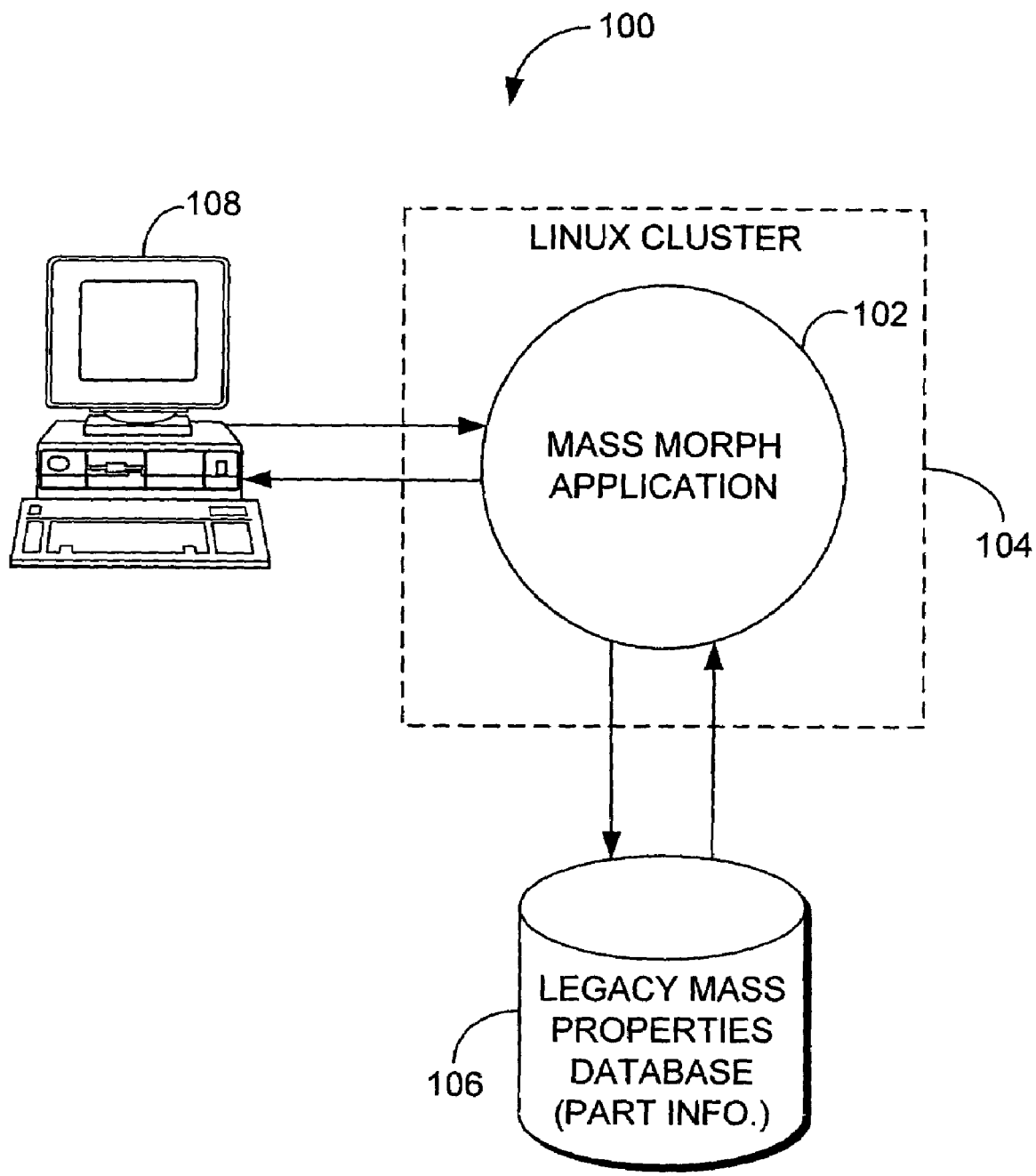
FIG. 1 is a representation of one environment in which the systems and methods of the present invention might be executed.

The present invention provides a system and method for generating mass-property models for aircraft as well as other product designs. To accomplish this, a robust numerical process provides for the efficient development of distributed mass properties in early engineering projects to design flight vehicles or other complex assemblies. The process extends the value of legacy mass properties data from previous design projects by morphing data representing previous design into the new project configurations. The process builds linear transformations in four-dimensional homogeneous coordinates which capture source and target geometric characteristic shapes.

Filters which make use of regular expressions, functional group classifications, part names, assembly names, inertial bay names, volumes, and/or using Nastran grid nomenclature to filter source mass property. These detailed mass properties are collected into bay wise functional groups. Lumped mass data including weight, center of gravity, moments and products of inertia are then converted to equivalent mass particulates. These point masses are transformed from the source domain to the target domain, and summed back together to generate target mass property data. Mass is then scaled using optional volume, area, or linear ratios extracted from the source and target offsets of the mass particulates. The process outputs detailed mass property distributions used in engineering simulations, functional group reports with provide target weight and center of gravity data used for establishing weight control datums, and morphed Nastran models.

The entire process is integrated into multi-disciplinary optimization processes used to optimize configuration design. The process is updated as the design project matures, blending morphed data with detailed design and providing high fidelity mass properties data throughout the project development.

Various technical terms are used throughout this description. These definitions are intended to provide a clearer understanding of the ideas disclosed herein but are in no way intended to limit the scope of the present invention. The definitions and terms should be interpreted broadly and liberally to the extent allowed the meaning of the words offered in the above-cited reference.

As one skilled in the art will appreciate, the present invention may be embodied as, among other things: a method, system, or computer-program product. Accordingly, the present invention may take the form of a hardware embodiment, a software embodiment, or an embodiment combining software and hardware. In a preferred embodiment, the present invention takes the form of a computer-program product that includes computer-useable instructions embodied on one or more computer-readable media.

Computer-readable media include both volatile and nonvolatile media, removable and nonremovable media, and contemplates media readable by a database, a switch, and various other network devices. Network switches, routers, and related components are conventional in nature, as are means of communicating with the same. By way of example, and not limitation, computer-readable media comprise computer-storage media and communications media.

Computer-storage media, or machine-readable media, include media implemented in any method or technology for storing information. Examples of stored information include computer-useable instructions, data structures, program modules, and other data representations. Computer-storage media include, but are not limited to RAM, ROM, EEPROM, flash memory or other memory technology, CD-ROM, digital versatile discs (DVD), holographic media or other optical disc storage, magnetic cassettes, magnetic tape, magnetic disk storage, and other magnetic storage devices. These memory components can store data momentarily, temporarily, or permanently.

Communications media typically store computer-useable instructions—including data structures and program modules—in a modulated data signal. The term "modulated data signal" refers to a propagated signal that has one or more of its characteristics set or changed to encode information in the signal. An exemplary modulated data signal includes a carrier wave or other transport mechanism. Communications media include any information-delivery media. By way of example but not limitation, communications media include wired media, such as a wired network or direct-wired connection, and wireless media such as acoustic, infrared, radio, microwave, spread-spectrum, and other wireless media technologies. Combinations of the above are included within the scope of computer-readable media.

The system and methods of the present invention dramatically reduce the conventional time required to prepare conceptual models for new aircraft designs. The modeling process, which used to take months, may be shortened to just a couple of days, and also produces a much more robust model.

At the core of the system is a legacy database which contains the mass properties of all assemblies on already existing aircraft, such as weight and center of gravity. The process accesses highly detailed legacy mass properties and finite element models for selected assemblies for the new aircraft, i.e., the avionics, hydraulics, and wing structures, and combines the mathematical properties of these assemblies into one functional model. More specifically, the process of the present invention relies on mass particulation to transform both mass data to the target aircraft, and performs transformations in homogeneous coordinates (four-dimensions) to accommodate linear transformations for taper in addition to translation, rotation, shear, and scaling. This enables the creation of a mass-properties target model. Designers and engineers are then able to use this robust model to perform various assessments such as vibration analysis, strength analysis, and other procedures to ensure the highest performance and lowest weight aircraft design.

At the core of the system is a legacy database which contains the mass properties of all assemblies on already existing aircraft. Mass properties data include, but are not limited to, part classification information, part and assembly information, part weight, center of gravity (CG), and moments and products of inertia. The process accesses highly detailed legacy mass properties and finite element models for selected assemblies for the new aircraft, i.e., the avionics, hydraulics, and wing structures, and combines the mathematical properties of these assemblies into one functional model. More specifically, the process of the present invention relies on mass particulation to transform mass data to the target aircraft. Morphing transformations are linear transformations in four-dimensional homogeneous coordinates to accommodate taper in addition to translation, rotation, shear, and scaling. This enables the creation of a mass-properties target model. Designers and engineers are then able to use this robust model to perform various assessments such as vibration analysis, strength analysis, and other procedures to ensure the highest performance and lowest weight aircraft design.

In addition to the time-saving aspects of the present invention, the process also reduces risk caused by the required aggregation of data. Because the disclosed processes enable the user to extract complicated mass properties data for the numerous assemblies and incorporate them into a new model, weight and balance issues will be recognized earlier in the development process, which eliminates the likelihood of the eleventh-hour reengineering issues often encountered using conventional methods. This also results in the timely review of alternate design approaches, and closes automation gaps for multi-disciplinary analysis and optimization.

The present invention is also readily useable along with other modeling techniques. For example, the process readily blends the morphed mass properties obtained from legacy aircraft databases along with new analysis models to support any phase of product development.

The models generated are easily searchable, and the process produces a detailed report of target weights and CGs by functional group, and distributed mass properties for loads, dynamics, and aeroelastic stability functions, and conforms mass properties to detailed finite element models for structural analysis. The process provides extensive query capabilities by functional group, part, next higher assembly, inertial bay, volume, and/or FEM grid using regular expressions, which makes it a good research tool for use with legacy aircraft databases.

The process also provides new flexibility by allowing engineers to quickly review tradeoffs of distinct design approaches and the supports robust analyses required for optimization.

Figure 2A:
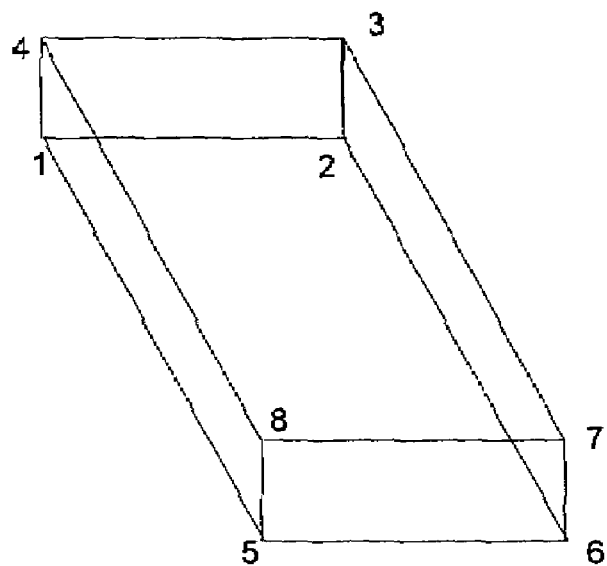
FIG. 2A is an illustration of a source bay defined by control points.
Figure 2B:
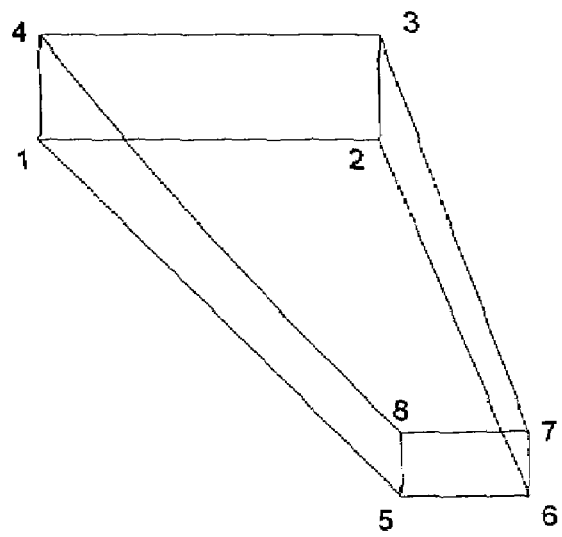
FIG. 2B is an illustration of a target bay defined by control points.
Figure 3:
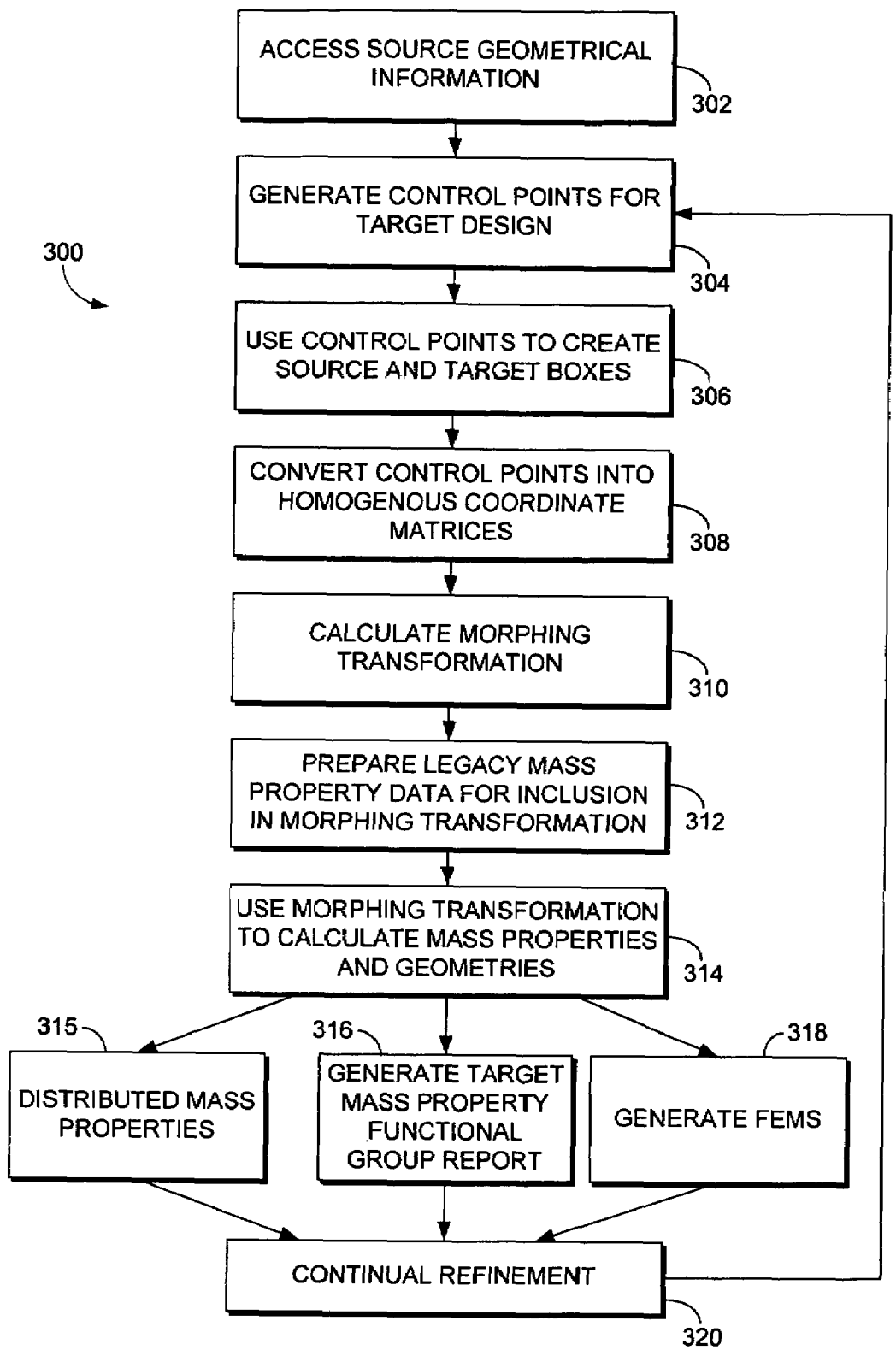
FIG. 3 is a high level flow diagram showing one embodiment for the processes of the present invention.

Exemplary embodiments of the present invention are disclosed in FIGS. 1-3. FIG. 1 shows an embodiment for one environment in which the processes of the present invention can be executed. As shown in FIG. 1, a system 100 includes several components. A morphing process 102, which in the preferred embodiment is written in Fortran90, runs on a Linux Cluster 104. It is important to note, however, that other languages and platforms could be used alternatively and still fall within the scope of the present invention as will be recognizable to one skilled in the art. Fortran90 has been selected here because it is the preferred language for analytical methods, and Linux has been selected as the preferred platform because of its aptitude for high performance computing.

The user (not shown), in the preferred embodiment, normally will run the process as a batch program with input files being transmitted to application 102 from a UNIX workstation or PC 108. Workstation 108 is connected into or included within cluster 104, and thus enables interfacing with application 102, which accesses a legacy database 106.

Aircraft and other production companies normally maintain databases on which weight and balance information is maintained regarding older versions of the products. The process of the present invention requires a continued commitment to maintain the quality of relevant legacy mass property databases. This closes the loop to give engineers supporting sustaining mass properties projects indirect ownership of the integrity of advanced design mass properties.

The Weights engineer typically first creates points in the CAD system to capture the characteristic shapes of both source and target geometry. Target geometry can be driven by a spreadsheet of parametric input parameters such as, i.e., wing sweep, dihedral, aspect ratio, reference wing area, taper ratio, skin thickness, etc. Morphing relies on linear transformations in homogeneous coordinates and mass particulation to transform mass properties. Regular expressions are used to set up source filters to transform mass properties and/or FEMs by inertia bay, functional group code, part, assembly, volume, or by grid nomenclature to produce the desired target aircraft. The process has extensive syntax and error checking to provide immediate feedback on potential data integrity issues. Internally, process 102 lumps mass data into unique bay/function group sets, and transforms data for function group reports and distributed properties output.

Once a mass property model has been created for a given project, it can be directly plugged into automated analyses that optimize an aircraft configuration for weight and mission performance, with aeroelastic stability, strength, buckling, damage tolerance and other design constraints. Candidate design approaches can be quickly compared and reviewed. Design from engineering CAD models can be readily blended into the process to support any phase of design activity. This is accomplished by encoding in process input deck to narrow the scope of morphed data through the extensive filtering options while filtering in including new CAD derived mass properties data for the active project from it's mass properties database when available.

Linear Transformations

The morphing process builds linear transformations in homogeneous coordinates to transform mass data from the source to the target geometry. Non-linear transformations such as twisting or bending can be accomplished by creating morphing transformations for each inertia bay.

Inertia bays are geometric zones on the aircraft that with discretization defined by Loads, Dynamics, and Aeroelastic Stability. Typically rib or bulkhead stations separate inertia bays, with separate bays for balance weights, and gear components, etc.

Linear transforms have a few specific desirable characteristics. Linear transformations are reversible, which means one can transform source data to the target design and back again and get the original input geometry and mass properties. This gives engineers that the process is behaving properly. Also, co-linear points before the transformation remain co-linear after the transformation—which helps engineers understand how the geometry is being manipulated. Linear transformations are desirable because the engineer doesn't need to check or compensate for non-linear distortions which might skew results. Non-linear methods can produce undesirable or unexpected distortions, or order dependant results. Here, linear transformations force the user to discretize the mappings to achieve non-linear results.

Homogeneous Coordinates

Instead of representing each coordinate (x, y, z) in three-dimensional space as a single three-dimensional vector:

$$\begin{bmatrix} x \\ y \\ z \end{bmatrix}$$

Homogenous coordinates allow each point (x, y, z) to be represented by an infinite number of four-dimensional vectors:

$$\begin{bmatrix} t \cdot x \\ t \cdot y \\ t \cdot z \\ t \end{bmatrix}$$

The three-dimensional vector corresponding to any four-dimensional vector can be computed by dividing the first three elements by the fourth, and a four-dimensional vector corresponding to any three-dimensional vector can be created by simply adding a fourth element and setting it equal to one.

Homogenous coordinate transformation matrices operate on four-dimensional vector representations of traditional three-dimensional coordinate locations. Linear transformations of homogenous coordinates are represented by the following matrix equation, $$\begin{bmatrix} t_{2g}x_2 \\ t_{2g}y_2 \\ t_{2g}z_2 \\ t_2 \end{bmatrix} = \begin{bmatrix} a_{11} & a_{12} & a_{13} & a_{14} \\ a_{21} & a_{22} & a_{23} & a_{24} \\ a_{31} & a_{32} & a_{33} & a_{34} \\ a_{41} & a_{42} & a_{43} & a_{44} \end{bmatrix} \begin{bmatrix} t_{1g}x_1 \\ t_{1g}y_1 \\ t_{1g}z_1 \\ t_1 \end{bmatrix}$$

Linear transformations in homogenous coordinates provide advantages of being able to perform taper and translation transformations in addition to rotation, shearing, and scaling transformations.

Building Morphing Transformations

The process of the present invention methodology allows target base geometry to be manipulated directly from parametric spreadsheet input. This provides the flexibility to automate design permutations for multi-disciplinary analysis. The base geometry for source aircraft models is derived from the parametric spreadsheet input geometries of existing aircraft.

Consider the process of morphing a new wing design using data received from legacy database 106. In order to morph the mass properties legacy wing design into a target design according to the principles of the present invention, the geometries of the legacy source designs selected will have certain design parameters which are different from the parameters of the target design. For example, the wings are likely to have different locations, sizes, aspect and taper ratios, sweep, and dihedral angles.

Once these parameters are known, box geometry is created to encapsulating geometric characteristics including location, size, aspect ratio, taper ratio, sweep, and dihedral. Referring now to FIGS. 2A and 2B, a simplified example of Before and After box geometries for a wing are shown. In each of these figures, corners 1-8 represent control points. These points will be used to control the transformation. The linear transformation is derived by normalizing source and target control points. Considering the equation:

$$[A]=[tmat][B] [tmat]=[A][B]^t([B][B]^t)^{-1}$$

the before ("B") matrix represents the source coordinates, and the after ("A") matrix represents the target coordinates. A least squares fit of the geometric transformation is performed. Least squares fitting is a method of model estimation in which a best estimate is selected as one that minimizes the sum of squares of deviations of the data points from the values predicted based on the model. In solving the linear transformation matrix, $$[tmat] = \begin{bmatrix} a_{11} & a_{12} & a_{13} & a_{14} \\ a_{21} & a_{22} & a_{23} & a_{24} \\ a_{31} & a_{32} & a_{33} & a_{34} \\ a_{41} & a_{42} & a_{43} & a_{44} \end{bmatrix}$$

values for t are set to unity for the source coordinates, $$[B] = \begin{bmatrix} x_{B_1} & x_{B_2} & L & x_{B_n} \\ y_{B_1} & y_{B_2} & & y_{B_n} \\ z_{B_1} & z_{B_2} & & z_{B_n} \\ 1 & 1 & & 1 \end{bmatrix}$$

but not for target coordinates, $$[A] = \begin{bmatrix} t_{A_1}g x_{A_1} & t_{A_2}g x_{A_2} & L & t_{A_n}g x_{A_n} \\ t_{A_1}g y_{A_1} & t_{A_2}g y_{A_2} & & t_{A_n}g y_{A_n} \\ t_{A_1}g z_{A_1} & t_{A_2}g z_{A_2} & & t_{A_n}g z_{A_n} \\ t_{A_1} & t_{A_2} & & t_{A_n} \end{bmatrix}$$

An algorithm included in process 102 accommodates taper transformations by initially setting all $t_A$ values to unity, and then iterates to find optimal $t_A$ values. This minimizes differences between the target and transformed source geometry. The output provides the engineer a quality assessment as to how closely target points match transformed source points.

Mass Particulation

Mass particulation is a process that reduces inertia data into an equivalent point mass representation. This simplifies the application of morphing transformations for inertia data. The transformed point masses are then reconstituted to produce inertia data for the new geometry.

Mass properties include the coordinate for the center of gravity (CGx, CGy, CGz), weight (W), moments of inertia (Ixx, Iyy, Izz), and products of inertia (Ixy, Ixz, Iyz). The inertia matrix, $$\begin{bmatrix} Ixx & -Ixy & -Ixz \\ -Ixy & Iyy & -Iyz \\ -Ixz & -Iyz & Izz \end{bmatrix}$$

can be defined with respect to principle axes [T], through Jacobi rotations (commonly used for Eigenvalue solutions) such that the principle inertias [Ixx', Iyy', Izz'] are with respect to the principle axes.

$$\begin{bmatrix} Ixx' & 0 & 0 \\ 0 & Iyy' & 0 \\ 0 & 0 & Izz' \end{bmatrix} = [T]^T \begin{bmatrix} Ixx & -Ixy & -Ixz \\ -Ixy & Iyy & -Iyz \\ -Ixz & -Iyz & Izz \end{bmatrix} [T]$$

Once the principle axes and inertias are derived, the mass object can be decomposed directly into eight point masses of equal weight. When summed together they yield the same inertia data as the original mass. The offsets (x', y', z') of the eight mass points relative to the CG and principle axes [T] are calculated as follows:

$$Ixx' = \int (y'^2 + z'^2) dm = \int y'^2 dm + \int z'^2 dm = I_2 + I_3$$

$$Iyy' = \int (x'^2 + z'^2) dm = \int x'^2 dm + \int z'^2 dm = I_1 + I_3$$

$$Izz' = \int (x'^2 + y'^2) dm = \int x'^2 dm + \int y'^2 dm = I_1 + I_2$$

$$I_1 = \int x'^2 dm = \frac{1}{2}(Iyy' + Izz' - Ixx')$$

$$I_2 = \int y'^2 dm = \frac{1}{2}(Ixx' + Izz' - Iyy')$$

$$I_3 = \int z'^2 dm = \frac{1}{2}(Ixx' + Iyy' - Izz')$$

$$m' = \frac{m}{8}$$

$$x' = \sqrt{\frac{I_1}{m}}$$

$$y' = \sqrt{\frac{I_2}{m}}$$

$$z' = \sqrt{\frac{I_3}{m}}$$

Appropriate integrity checks ensure that moments and products of inertias are not ill formed.

Scaling Mass

The moments and products of inertia are also used to scale mass in the morphing procedure. A number of options are available that take advantage of the relative offsets of the mass particulates (x', y', z') to scale mass weight. (A particulate is a thing constructed of separate and distinct particles). If a functional group/inertia bay combination represents solid type parts, mass can be scaled by the relative volumes derived from source and target offsets. If the functional group/inertia bay combination is of shell type parts, mass can be scaled by the relative wetted areas (two dimensional mass scaling) derived from the source target offsets. The wetted area is calculated from the six sides of the box created from the eight mass particulates. If the user chooses this mass scaling option, the mass is scaled using multiplying the source weight by the area of the mass particulate box after the morphing transformation dividing by the area of the mass particulate box after the transformation. Likewise, volume (3 dimensional), and linear (1 dimensional) mass scaling options derive their scaling factors from the mass particulation offsets. If the functional group/inertia bay combination is to be stretched, a linear transformation derived on the relative offsets can be used. Other explicit and global scaling factors can be applied to explicitly size skin gages, etc. Typically an area mass scaling is used for aircraft structure. A volume scaling is used for solid parts like balance weights, fittings, etc. And a linear mass scaling is used to extrude parts like cable assemblies.

Filtering Mechanisms

Filtering mechanisms aid in the ability to associate the desired design features from the source aircraft with appropriate morphing transformations to build the target aircraft. The process of the present invention uses an open source library for regular expressions to provide a rich and robust wild-card capacity. Mass data can be filtered logically by inertia bay, part, assembly, etc. Filters also provide the engineer with powerful query tools for researching legacy project mass properties data.

Hierarchal Functional Groups

Traditionally the aircraft industry has managed mass properties by coding parts into functional categories. The present invention, in the development of database 106, uses an even more defined hierarchal coding system which is ideal for making mass property estimations per the processes of the present invention. The hierarchy organizes parent/child code relationships through a tree structure with the top of the tree representing the complete aircraft. E.g., for an aircraft a master code would be assigned to the whole aircraft. Next, a subcode from the master would be assigned to a wing assembly. After that, a subcode of the wing code would be developed to identify a middle spar. This coding process breaks the entire plane down into a multiplicity of easily searchable groups. Because the number of functional groups is great, e.g., a typical aircraft may have from 600 to 2,500 different codes, a hierarchal coding system which is easily queried is necessary from a data management standpoint. And by giving like functional groups the same codes for different legacy aircraft, management system helps drive consistency in part categorization for all aircraft designs. It also reduces the number of codes on many models where higher level of detail is not needed to support advanced design or weight control objectives. The hierarchal codes allow the Engineer to do Boolean operations between high level and low level codes to capture the specific details desired.

The continued development of maintenance of this database enables the method of the present invention to filter the legacy mass properties database 106 by functional categories at all levels of detail. This approach allows the morphing process to merge design concepts from multiple legacy design approaches with less uncertainty than traditional methods.

Volumetric Filtering

The process of the present invention provides the ability to do Boolean operations between volumes and other filters. Volumes are represented by a list of points that make up a point cloud or convex hull. Point order in the list does not matter. Physically, the volume is a three dimensional convex hull represented by the exterior points of the point cloud or list of points. Process 102 uses an efficient algorithm to test whether a CG or grid is internal to a single tetrahedron built from the list of points. The algorithm picks four non-planar points from the list and derives coefficients for a tetrahedron. If not encapsulated, process 102 recognizes which face of the tetrahedron the test point is beyond, and builds a new tetrahedron from the list of points (using that face and choosing the point farthest away in the appropriate direction) until either the point is captured or determined outside the volume.

Grid Filtering

Finite element models follow grid nomenclatures to differentiate components, e.g., skins from stringers, and specify sections of the airframe. Filters allow mapping of detailed mass properties into a finite element model by functional system as well as proximity. These filters also facilitate morphing of finite element models.

Morphing Finite Element Models

Process 102 also supports morphing Finite Element models from detailed legacy models. Finite Element model morphing only updates the grid geometric location from the source geometry to the target geometry. No grid are added or removed. Properties, Materials, Boundary conditions remain the same. This extends the value of these detailed models into new conceptual design projects. The method allows for quick parametric changes to the layout of conceptual design finite element geometry throughout the design exploration process. The process of the present invention supports all Nastran formats including short, long, comma, and/or tab-delimited data. The process of the present invention recursively resolves coordinate systems that are potentially built from other coordinate systems. Finite element model morphing does not renumber the output grid, maintaining a one-to-one mapping between source and target grid.

Conforming Detailed Mass Properties into Finite Element Models

The process of the present invention provides the flexibility to automatically conform mass properties from a detailed mass properties database onto any finite element model detail—whether a stick-model used for aeroelastic stability analysis, finite element models representing a physical test article, or fine local models used in damage tolerance analyses. The provided filtering capabilities allow definite mappings of specific mass properties functional groups, parts, assemblies, etc with specified grid nomenclature. The mass particulation offset terms are also used to determine grid in proximity the filtered of parts for a given inertia bay. These capabilities, for example, allow the engineer to tie seat and passenger mass properties to seat track grids, rather than spidering inertia loads to all grids on the perimeter of the bulkhead.

Cost Morphing

The process of the present invention also incorporates morphing financial cost models. Actual costs are tracked as an integral part of the procurement and manufacturing processes. The proposed process improvements will expose engineers to detail and assembly cost attributes through an assembly tree interface the author has already developed. These costs can be rolled up to show cost and weight for all assembly levels. Other data analyses will include net change analysis by assembly, net change by engineering change request, or aircraft serial number.

Every time an engineer makes a design change he is likely impacting weight and cost, but too often with little feedback on the cost he might be driving into the design as changes are made. The new process gives engineers and financial analysts a leading indicator on not only weight, but also costs.

Parts will be categorized by functional and manufacturing heuristics to for morphing costs. Weight is expected to be the primary driver for costs. These models will then support financial functions in advanced design for accurately predicting costs and weight and exposed to engineers to better inform design teams of the cost and weight in the design.

FIG. 3 is a diagram showing a process 300 in which the present invention might be embodied. In a first step 302, the user accesses geometrical information from legacy database 106. This information includes data related to the source design. Typically this data will be in the form of legacy CAD representations of lofted geometry.

In a next step 304, the user generates geometries for the target design. This can be done numerically or from CAD loft data. Once these geometries have been created, the geometric data will be received by the application 102 from workstation 108 as a batch run as discussed above.

Next, in a step 306, mass morph application 102 uses control points to create source and target boxes (like those shown in FIGS. 2A and 2B). These control boxes capture characteristic geometric shape information such as size, dihedral, sweep, taper, and thickness. This geometrical information is then used to define linear transformations including translation, rotation, shearing, scaling, stretching, and taper.

Next, in a step 308, the process converts the reciprocating source and target control points into homogenous coordinate matrices as already discussed in detail above. Using homogeneous coordinates adapts the data for manipulation.

In a next step 310, application 102 calculates a morphing transformation using the source and target coordinates generated in step 308. The transformation is converged through automated iterations such that it minimizes the differences between transformed source control points and target control points. This morphing transformation will be used to enable mass morphing.

In a step 312, application 102 defines volumetric, part, assembly, functional code (part classification), bay (geometric zone) and FEM grid filters. These definitions then, per a filtering process, control the scope of legacy mass properties to be included in the morphing transformation as input.

Once defined, the morphing transformation in a step 314 is used to calculate target mass properties and geometry based on the pre-existing highly detailed legacy source mass data, and FEMs.

It is at that point in diagram 300 that the process splits to provide three separate forms of output. In a step 315, application 102 generates the distributed mass properties for the target. Additionally, in a step 316, application 102 generates a mass property functional group report regarding the target. This report will most likely be used for project planning, weight control, distributed mass properties used for engineering simulation analyzes, and other like utilities. In yet another branch of the process, in a step 318 application generates FEMs. These FEMs are used for structural analysis as well as other purposes.

In a step 320, the process merges back together at a continual refinement step. It is here that the FEMs generated are continually updated in consideration of later actual design developments. For example, as actual design configuration details are developed and adjustments made, the morphed model is adaptable to blend in this new information with that developed in the modeling processes of steps 302-318. The process is also adapted to accommodated the blending in of CAD based mass properties which develop as detailed drawings are released. When any of these kinds of changes develop, it can be seen that the process is repeated (loops) back up to step 304 for remorphing. Thus, step 320 enables the continued updating of the model as the design process makes the progression from conceptual to the actual.

In summary, the present invention makes the investments of past mass property database projects quickly extensible to new project design. Simple point geometry inputs are used to represent the characteristic shapes of both source and target geometries. Then the process constructs linear transformations in homogeneous four-dimensional coordinates to represent complex transformations, e.g., taper. Legacy mass properties are input and transformed using a transformation matrix which has been derived from the process. The process enables the user to morph legacy finite element models and conform existing detailed mass properties into target finite element models of any complexity. The methodology is also extensible to other industries (e.g., any products for which mass properties are relevant) and types of analytical models, e.g., cost analysis.

As can be seen, the present invention and its equivalents are well-adapted to provide a method and system for morphing mass properties of a product using geometrical legacy and prospective design information. Many different arrangements of the various components depicted, as well as components not shown, are possible without departing from the spirit and scope of the present invention.

The present invention has been described in relation to particular embodiments, which are intended in all respects to be illustrative rather than restrictive. Alternative embodiments will become apparent to those skilled in the art that do not depart from its scope. Many alternative embodiments exist but are not included because of the nature of this invention. A skilled programmer may develop alternative means of implementing the aforementioned improvements without departing from the scope of the present invention.

It will be understood that certain features and subcombinations are of utility and may be employed without reference to other features and subcombinations and are contemplated within the scope of the claims. Not all steps listed in the various figures need be carried out order described.

The invention claimed is:

1. A system for generating a mass-property model of a target aircraft design comprising:
   a digital processor;
   a process controlled by the digital processor for implementing steps comprising:
   extracting mass properties regarding a source aircraft design from a database;
   establishing source homogenous coordinates defining at least one discrete source bay;
   incorporating said source homogenous coordinates into a source matrix;
   using target homogeneous coordinates defining at least one target bay;
   incorporating said target homogenous coordinates into a target matrix;
   calculating a transformation matrix using said source matrix and said target matrix to generate transformed source coordinates and target coordinates;
   converging said transformation matrix for transformations to minimize differences between the transformed source coordinates and the target coordinates, wherein said converging comprises:
   setting a fourth dimensional element of each homogeneous coordinate to unity in said source matrix;
   initializing a fourth dimensional element in said target matrix at unity; and
   repeatedly changing the value of said fourth dimensional element in said target matrix until normalization is achieved;
   using the source homogenous coordinates and the target homogeneous coordinates to generate new target coordinates;
   morphing source mass property information into target mass property information using said new target coordinates to generate the mass-property model; and
   generating a report including characteristics of the mass-property model.

2. The system of claim 1 comprising:
performing a least squares fit in generating said target coordinate system.

3. The system of claim 1 including:
using the system to perform one of taper, translational, rotational, shearing, and scaling transformations.

4. The system of claim 1 comprising:
manipulating target base geometry directly from parametric spreadsheet input.

5. The system of claim 1 comprising:
using box geometries to comprise each of said source and target bays;
using each of said source homogeneous coordinates as a control point at one corner of a source box; and
using each of said target homogeneous coordinates as a control point at one corner of a target box.

6. The system of claim 1 wherein said system generates said model of one of centers of gravity, weights, and moments of inertia of the target design.

7. The system of claim 1 comprising:
reducing source inertial data into equivalent point mass representations so that said source inertial data is useable in said morphing step.

8. The system of claim 1 comprising:
calculating the offsets of mass points relative to the center of gravity given moments of inertia and the products of inertia; and
scaling mass using said offsets.

9. A system for generating a mass property model for a target product design comprising:
a digital processor executing instructions for:
extracting legacy mass properties information regarding a source product design from a legacy database;
defining a plurality of discrete source bays which together substantially represent said source product geometry;
using said plurality of source bay coordinates and said plurality of target bay coordinates to determine a transform;
using said transform to generate transformed target geometries;
using said transformed target geometries for making source to target mass property transformations to generate the mass property model; and
generating a report including characteristics of the mass-property model.

10. The system of claim 9 comprising:
reducing source inertial data into equivalent point mass representations before making said target mass property transformations.

11. The system of claim 9 comprising:
calculating offsets of mass points relative to the center of gravity given moments of inertia and the products of inertia; and
scaling target product mass using said offsets.

12. The system of claim 9, wherein said method is adapted to use box geometries to comprise source and target bays, use source homogeneous coordinates as a control points at each corner of a source box, use target homogeneous coordinates as a control points at each corner of a target box, and create linear transformations to generate target geometries for the mass property model.

13. The system of claim 9, wherein said legacy database is organized such that functional part groups are coded in a hierarchal fashion; wherein parent/child code relationships are organized via a tree structure with the top of the tree representing the complete target product.

* * * * *